(12) United States Patent
Shi et al.

(10) Patent No.: US 9,413,302 B2
(45) Date of Patent: Aug. 9, 2016

(54) DIGITAL PREDISTORTION APPARATUS AND METHOD

(71) Applicant: FUJITSU LIMITED, Kawasaki-shi, Kanagawa (JP)

(72) Inventors: Zhan Shi, Beijing (CN); Hui Li, Beijing (CN); Jianmin Zhou, Beijing (CN); Takanori Iwamatsu, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/448,240

(22) Filed: Jul. 31, 2014

(65) Prior Publication Data

US 2015/0061773 A1     Mar. 5, 2015

(30) Foreign Application Priority Data

Aug. 30, 2013    (CN) .......................... 2013 1 0389536

(51) Int. Cl.
*H03F 1/32*     (2006.01)
*H03F 3/24*     (2006.01)
*H03F 3/19*     (2006.01)

(52) U.S. Cl.
CPC .............. *H03F 1/3247* (2013.01); *H03F 3/19* (2013.01); *H03F 3/245* (2013.01); *H03F 2200/451* (2013.01); *H03F 2201/3224* (2013.01)

(58) Field of Classification Search
USPC .......................... 330/149; 375/296; 455/114.3
See application file for complete search history.

(56) References Cited

U.S. PATENT DOCUMENTS 7,333,559 B2 *   2/2008  Song .................... H03F 1/3247
                                                        375/296

* cited by examiner

*Primary Examiner* — Hieu Nguyen
(74) *Attorney, Agent, or Firm* — Arent Fox LLP

(57) ABSTRACT

A digital predistortion apparatus comprising: a nonlinear device; a memory effect compensator; a constant value characteristic acquirer; a cost function generator; and a coefficient updater is described.

12 Claims, 16 Drawing Sheets

DIGITAL PREDISTORTION APPARATUS AND METHOD

CROSS REFERENCE TO RELATED APPLICATIONS

This application claims priority to Chinese Patent Application No. 201310389536.2, filed Aug. 30, 2013, which is hereby incorporated by reference in its entirety.

TECHNICAL FIELD

The present application relates to the technical field of digital predistortion, and in particular to a digital predistortion apparatus and method for compensating for nonlinear and memory effect distortion.

BACKGROUND

A power amplifier (PA) is an important component in electronic equipment. It may amplify power of a weak electrical signal, so as to meet demands of transportation and transmission. It is expected in an ideal case that an output signal of a PA is obtained by ideally amplifying an input signal. However, for a physical reason, nonlinearity is often introduced into a PA, that is, besides the input signal being amplified, some extra unneeded signals are also added. In order to realize ideal amplification, such nonlinearity of the PA must be compensated and corrected.

Digital predistortion (DPD) technique is effective technical means for precompensating for nonlinearity of electronic equipment. Adaptive predistortion technique may adaptively adjust a coefficient of a predistorter according to a fed back output signal of a PA, so as to realize precompensation.

FIG. 1 is a schematic diagram of a part of the structure of a digital predistortion apparatus in the prior art. As shown in FIG. 1, the digital predistortion apparatus may include a digital predistortion unit 101, a signal transmitting unit 102, a feedback unit 103, a digital filter 104, and a predistortion coefficient unit 105, etc;

wherein, the signal transmitting unit 102 may include a digital analog converter (DAC) 1021, a quadrature modulator (QMOD) 1022, a variable gain amplifier (VGA) 1023, and a high power amplifier (HPA) 1024, etc. The feedback unit 103 may include a quadrature demodulator (QDMOD) 1031, and an analog digital converter (ADC) 1032, etc. The digital filter 104 may include a digital bandpass filer (DBPF), and a digital high pass filter (DHPF), etc. And the predistortion coefficient unit 105 may include a cost function calculating unit 1051, and a coefficient updating unit 1052, etc.

And on the other hand, as the increase of bandwidths of transmission signals, a PA further presents a "memory effect", that is, the current output signals of the PA are not only related to the current input signals, but also to previous input signals. And its amplitude and phase characteristics present "getting fat". FIGS. 2 and 3 show an amplitude (AM) characteristic and a phase (PM) characteristic of a power amplifier containing a memory effect, respectively. Nonlinearity and memory effect will destroy a transmission signal, affect signal reception quality and interfere with signals of neighboring channels. Therefore, they need to be overcome and compensated.

It should be noted that the above description of the background is merely provided for clear and complete explanation of the present application and for easy understanding by those skilled in the art. And it should not be understood that the above technical solution is known to those skilled in the art as it is described in the background of the present application.

SUMMARY

However, it was found by the inventors that in the prior art, affection of memory effect is not taken into account in much predistortion processing, and in solutions taking memory effect into account, complete IQ two-path signals usually need to be fed back and compared with original reference signals (complex signals).

FIG. 4 is a schematic diagram of a part of the structure of another digital predistortion apparatus in the prior art. As shown in FIG. 4, the digital predistortion apparatus needs a quadrature demodulator and a two-path analog digital converter, as well as corresponding measures opposing IQ imbalance, and data synchronization equipment and method are also needed, thereby resulting in relatively high cost of production.

Embodiments of the present application provide a digital predistortion apparatus and method, with an object being to overcome nonlinearity and memory effect by using a scalar method (that is, using a one-path feedback signal, rather than a reference signal), thereby simply and efficiently improving quality of a transmission signal.

According to an aspect of the embodiments of the present application, there is provided a digital predistortion apparatus, including:

a nonlinear device configured to compensate for a nonlinear characteristic of a signal;

a memory effect compensator configured to compensate for a memory effect characteristic of the signal;

a constant value characteristic acquirer configured to process a feedback signal, so as to acquire constant value characteristic information of the signal;

a cost function generator configured to calculate a predistorted cost function according to the acquired constant value characteristic information and a predefined value; wherein, the predefined value is pre-obtained according to a modulation mode of the signal; and a coefficient updater configured to update a coefficient of the nonlinear device and a coefficient of the memory effect compensator according to the cost function.

According to another aspect of the embodiments of the present application, there is provided a digital predistortion method, wherein a nonlinear characteristic of a signal is compensated by using a nonlinear device and a memory effect characteristic of the signal is compensated by using a memory effect compensator; the method including:

processing a feedback signal, so as to acquire constant value characteristic information of the signal;

calculating a predistorted cost function according to the acquired constant value characteristic information and a predefined value; wherein, the predefined value is pre-obtained according to a modulation mode of the signal; and updating a coefficient of the nonlinear device and a coefficient of the memory effect compensator according to the cost function.

An advantage of the present application resides in: by calculating a predistorted cost function according to the acquired constant value characteristic information and a predefined value, and updating a coefficient of the nonlinear device and a coefficient of the memory effect compensator, not only nonlinearity and memory effect distortion of a signal may be compensated, but also the structure is simple and low in cost, thereby simply and efficiently improving quality of a transmission signal.

With reference to the following description and drawings, the particular embodiments of the present application are disclosed in detail, and the principle of the present application and the manners of use are indicated. It should be understood that the scope of the embodiments of the present application is not limited thereto. The embodiments of the present application contain many alternations, modifications and equivalents within the spirits and scope of the terms of the appended claims.

Features that are described and/or illustrated with respect to one embodiment may be used in the same way or in a similar way in one or more other embodiments and/or in combination with or instead of the features of the other embodiments.

It should be emphasized that the term "comprises/comprising/includes/including" when used in this specification is taken to specify the presence of stated features, integers, steps or components but does not preclude the presence or addition of one or more other features, integers, steps, components or groups thereof.

DETAILED DESCRIPTION

These and further features of the present application will be apparent with reference to the following description and attached drawings. In the description and drawings, particular embodiments of the application have been disclosed in detail as being indicative of some of the ways in which the principles of the application may be employed, but it is understood that the application is not limited correspondingly in scope. Rather, the application includes all changes, modifications and equivalents coming within the spirit and terms of the appended claims.

A quadrature amplitude modulation (QAM) mode is most often used in a modern communication system, which is characterized by definitely knowing a particular constant numerical value to which an in-phase (I)/quadrature (Q) path or a modulus corresponds only if a particular mode of modulation of a signal (such as 16QAM, and 64QAM, etc.) is known, that is, a QAM signal has a constant value characteristic.

Figure 1:
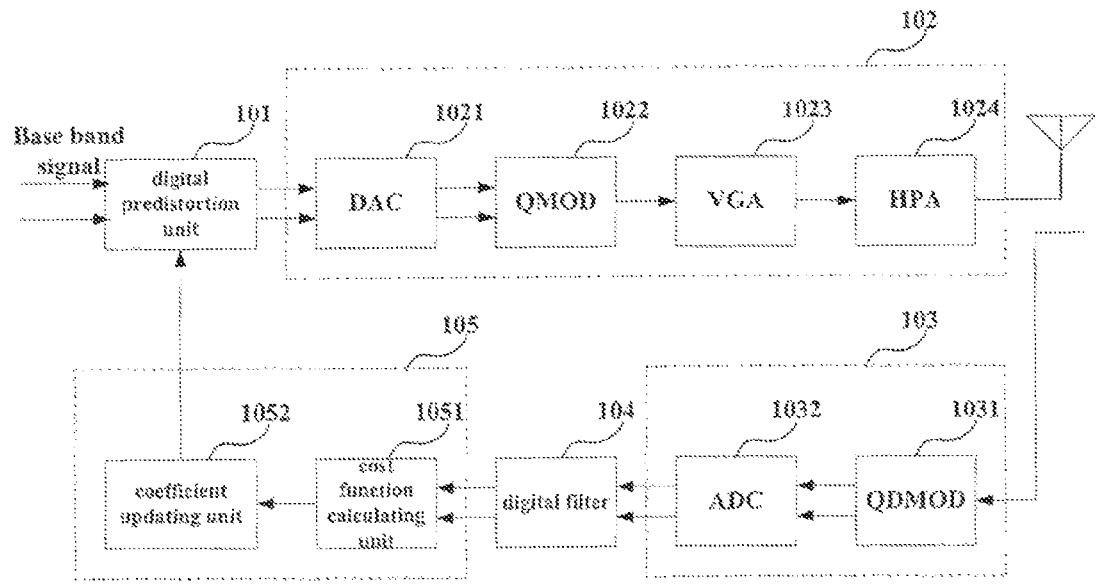
FIG. 1 is a schematic diagram of a part of the structure of a digital predistortion apparatus in the prior art.
Figure 2:
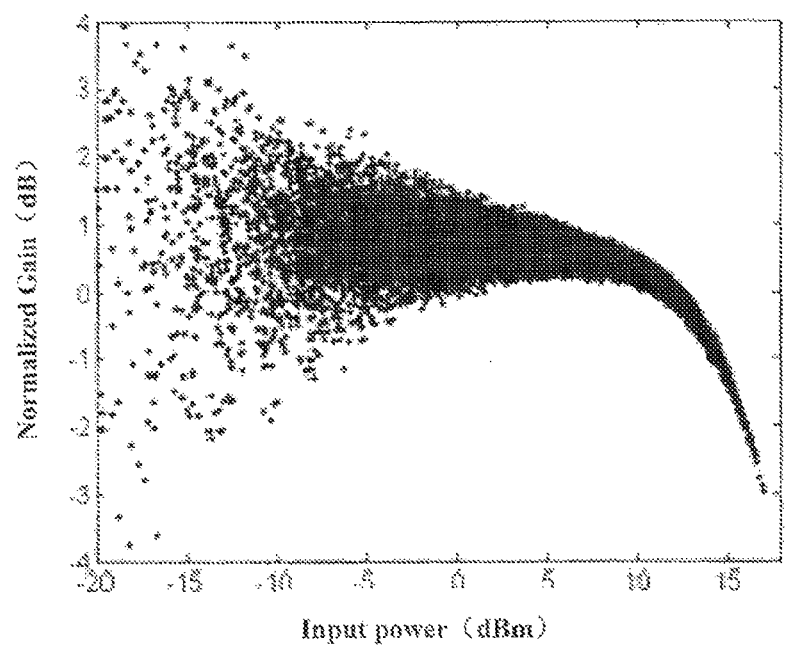
FIG. 2 is a schematic diagram showing an amplitude characteristic of a power amplifier containing a memory effect.
Figure 3:
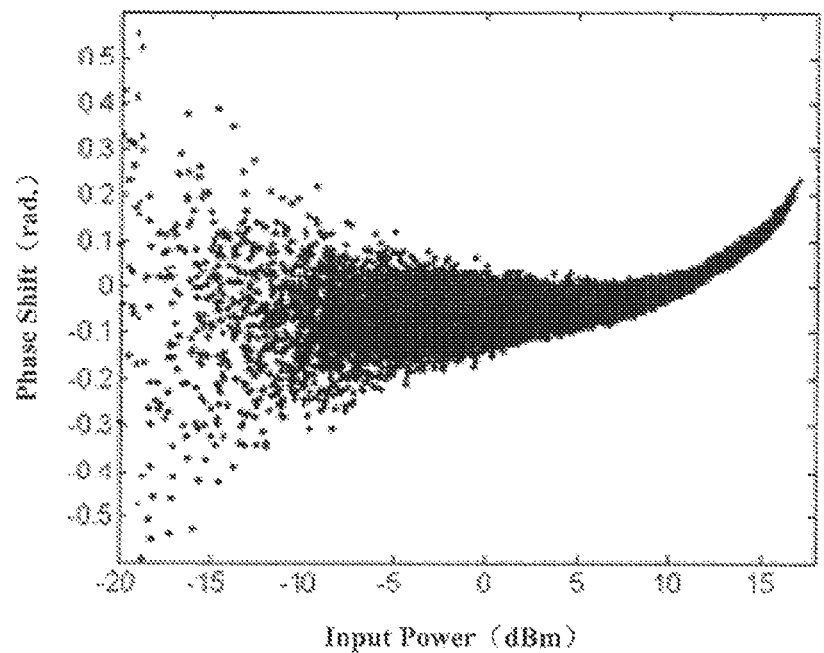
FIG. 3 is a schematic diagram showing a phase characteristic of a power amplifier containing a memory effect.
Figure 4:
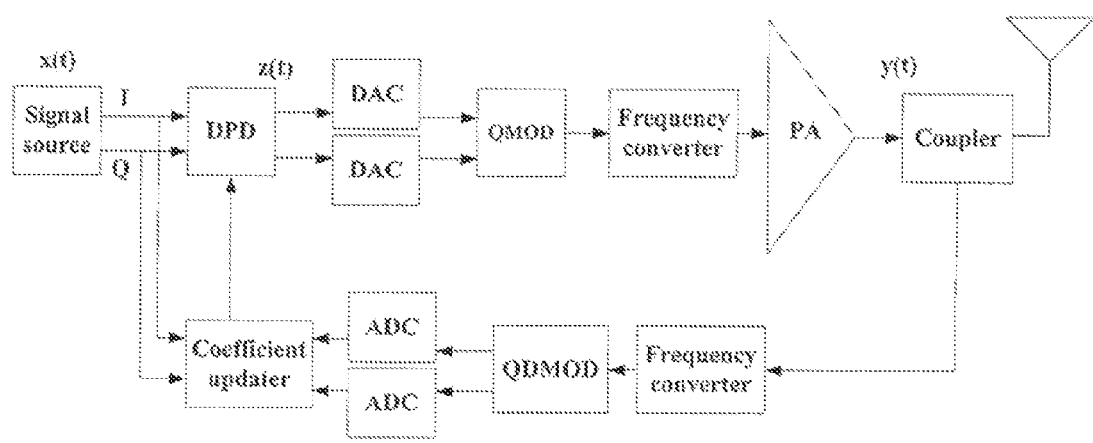
FIG. 4 is a schematic diagram of a part of the structure of another digital predistortion apparatus in the prior art.
Figure 5:
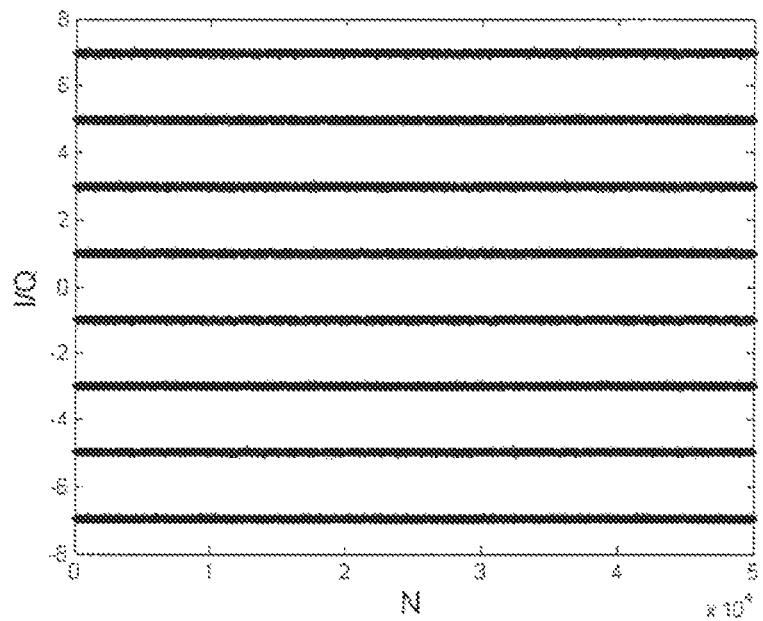
FIG. 5 is a schematic diagram of a constant value characteristic of I/Q-path signals.
Figure 6:
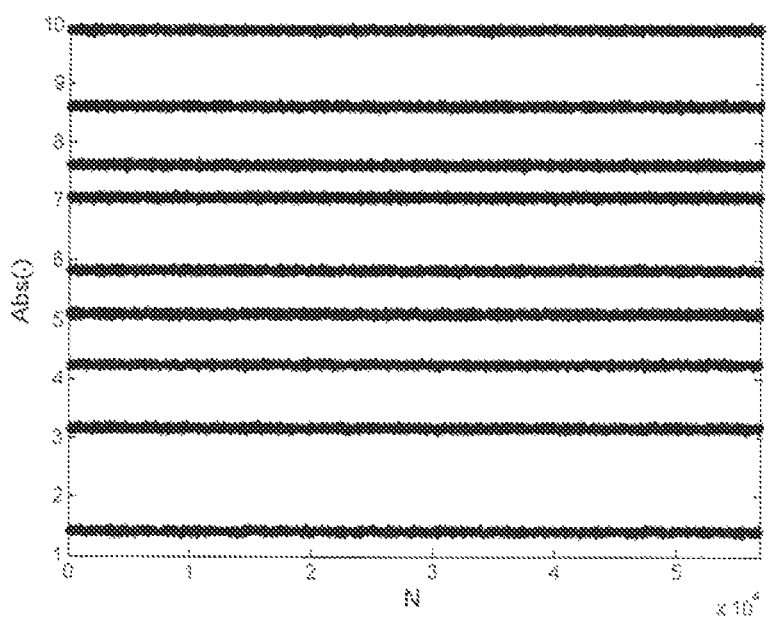
FIG. 6 is a schematic diagram of a constant value characteristic of a signal modulus.

Taking a 64QAM signal as an example, FIG. 5 is a schematic diagram of a constant value characteristic of I/Q-path signals, and FIG. 6 is a schematic diagram of a constant value characteristic of a signal modulus. As shown in FIG. 5 or 6, for a 64QAM signal, a particular constant numerical value to which an I/Q path or a modulus corresponds may be definitely obtained.

The similar characteristic also exists in a binary phase shift keying (BPSK) signal. The relevant art may be referred to for a definition and detailed contents of a constant value characteristic of a signal. The present application shall further be described below taking a QAM signal as an example. However, the present application is not limited thereto, and may also be applicable to other signals having constant value characteristics, for example.

Figure 7:
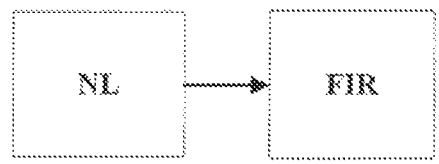
FIG. 7 is a schematic diagram of a Hammerstein model.

On the other hand, for a predistorter for compensating for nonlinearity and memory effect, there may be three types of frequently-used models of predistorters, namely, Hammerstein model, Weiner model, and Weiner-Hammerstein model. FIG. 7 is a schematic diagram of a Hammerstein model, FIG. 8 is a schematic diagram of a Weiner model, and FIG. 9 is a schematic diagram of a Weiner-Hammerstein model.

Figure 8:
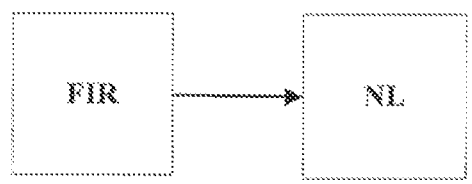
FIG. 8 is a schematic diagram of a Weiner model.
Figure 9:
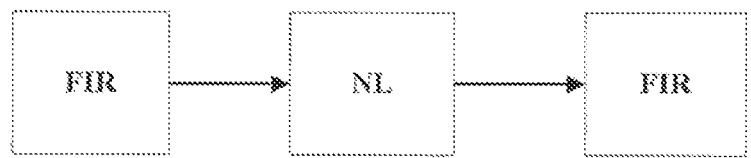
FIG. 9 is a schematic diagram of a Weiner-Hammerstein model.

As shown in FIGS. 7-9, NL denotes a nonlinear device, and FIR denotes a finite impulse response (FIR) filter. The NL may be used to compensate for a nonlinear characteristic of a signal, and the FIR may be used to compensate for a memory effect characteristic of a signal. The relevant art may be referred to for the above three types of models and detailed contents of the NL and FIR.

The present application shall be described below taking only the Hammerstein model as an example. However, the present application is not limited thereto, and is also applicable to the Weiner model and the Weiner-Hammerstein model. For example, it may also be such models as a memory polynomial, and an artificial neural network, etc. Furthermore, it should be noted that the memory effect compensator in the present application takes only an FIR filter as an example. However, the present application is not limited thereto, and other devices for memory effect compensation may be employed, such as an infinite impulse response (IIR) filter, etc.

Embodiment 1

Figure 10:
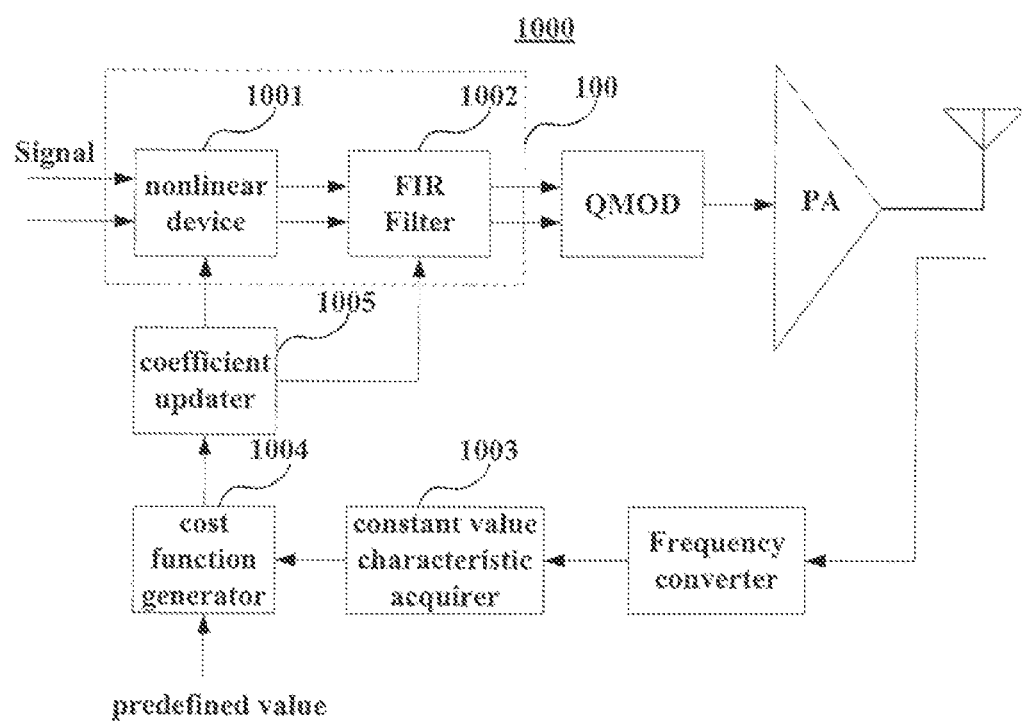
FIG. 10 is a schematic diagram of the structure of a digital predistortion apparatus of an embodiment of the present application.

An embodiment of the present application provides a digital predistortion apparatus, which shall be described taking a Hammerstein model and an FIR filter as examples. FIG. 10 is a schematic diagram of the structure of the digital predistortion apparatus of the embodiment of the present application.

As shown in FIG. 10, the digital predistortion apparatus 1000 includes a digital predistorter 100, a constant value characteristic acquirer 1003, a cost function generator 1004 and a coefficient updater 1005; wherein, the digital predistorter 100 includes a nonlinear device 1001 and an FIR filter 1002. It should be noted that only part of the components are shown in FIG. 10, and the relevant art may be referred to for other components that are not shown;

wherein, the nonlinear device 1001 is configured to compensate for a nonlinear characteristic of a signal; the FIR filter 1002 is configured to compensate for a memory effect characteristic of the signal; the constant value characteristic acquirer 1003 is configured to process a feedback signal, so as to acquire constant value characteristic information of the signal; the cost function generator 1004 is configured to calculate a predistorted cost function according to the acquired constant value characteristic information and a predefined value; wherein, the predefined value is pre-obtained according to a modulation mode of the signal; and the coefficient updater 1005 is configured to update a coefficient of the nonlinear device 1001 and a coefficient of the FIR filter 1002 according to the cost function.

As shown in FIG. 10, the digital predistorter includes the nonlinear device 1001 and the FIR filter 1002, and the Hammerstein model is taken as an example. However, the present application is not limited thereto, and other models may also be employed; wherein, the coefficient of the FIR filter 1002 may include $\alpha$, $\beta$, $\gamma$, and the relevant art may be referred to for detailed contents of the nonlinear device 1001 and the FIR filter 1002.

In this embodiment, constant value characteristic information to which I/Q paths or moduli correspond may be obtained according to a particular modulation mode (such as 64QAM) of the signal, therefore, the predefined value may be pre-obtained according to the modulation mode of the signal. Taking 64QAM as an example, predefined values corresponding to I/Q signals may be "−7, −5, −3, −1, 1, 3, 5, 7"; and predefined values corresponding to the moduli may be "$\sqrt{2}, \sqrt{10}, \sqrt{18}, \sqrt{26}, \sqrt{34}, \sqrt{50}, \sqrt{58}, \sqrt{74}, \sqrt{98}$".

Taking 16QAM as an example, predefined values corresponding to I/Q signals may be "−3, −1, 1, 3", etc., and particular predefined values may be determined according to an actual situation. Following description is given taking 64QAM as an example.

In this embodiment, the feedback signal may be processed to obtain constant value characteristic information of the signal; and then the acquired constant value characteristic information is compared with the predefined value to calculate the cost function, thereby updating the coefficient of the nonlinear device and the coefficient of the FIR filter; wherein, initial values may be preset for the coefficient of the nonlinear device and the coefficient of the FIR filter. For example, they may be set according to empirical values, or may be initialized into zero; and then the parameters are updated by calculating the cost function according to the present application, and an optimal parameter may be obtained after one or more times of iteration. Therefore, the nonlinearity and memory effect may be overcome by using only a one-path feedback signal, rather than a reference signal, thereby simply and efficiently improving quality of a transmission signal.

In a mode of implementation, it may be carried out according to the constant value characteristic of the I/Q-path signals, and the coefficient of the nonlinear device may be calculated according to side lobe information of a feedback signal.

Figure 11:
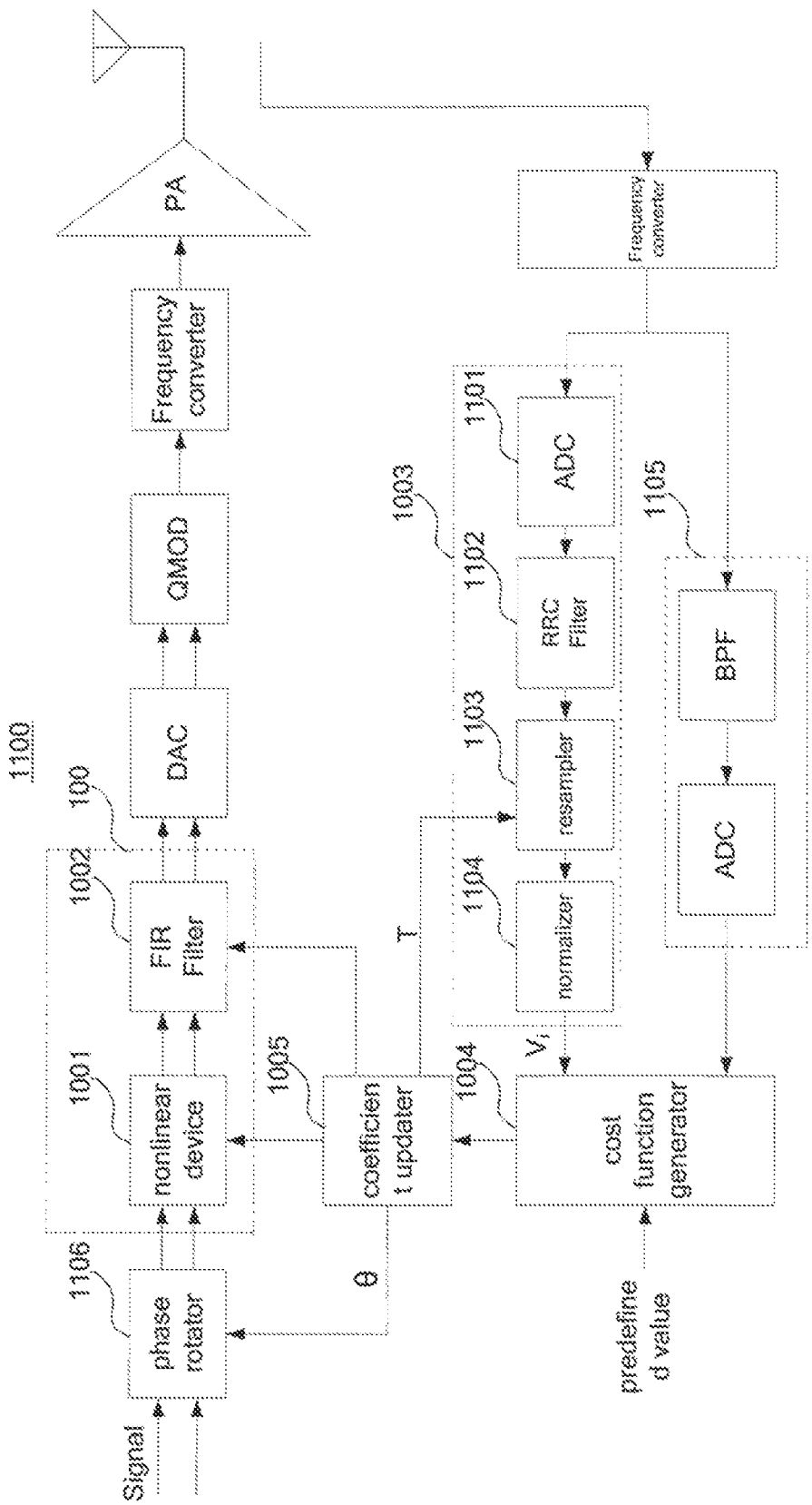
FIG. 11 is another schematic diagram of the structure of the digital predistortion apparatus of the embodiment of the present application.

FIG. 11 is another schematic diagram of the structure of the digital predistortion apparatus of the embodiment of the present application. As shown in FIG. 11, the digital predistortion apparatus 1100 includes a digital predistorter 100, a constant value characteristic acquirer 1003, a cost function generator 1004 and a coefficient updater 1005; wherein, the digital predistorter 100 includes a nonlinear device 1001 and an FIR filter 1002, as described above.

As shown in FIG. 11, the digital predistortion apparatus 1100 may further include a side lobe information acquirer 1105 configured to process the feedback signal, so as to obtain side lobe information of the feedback signal. The feedback signal may be divided into two paths after frequency conversion, the constant value characteristic information is obtained from one path by the constant value characteristic acquirer 1003, and the side lobe information of the feedback signal is obtained from the other path by a bandpass filter (BPF).

As shown in FIG. 11, the constant value characteristic acquirer 1003 may include: an analog-to-digital converter 1101 configured to convert the feedback signal into a digital signal; a root raised cosine (RRC) filter 1102 configured to process I/Q signals of the digital signal; a resampler 1103 configured to resample the digital signal after being processed by the RRC filter 1102; and a normalizer 1104 configured to normalize the resampled digital signal, so as to obtain the constant value characteristic information of the signal.

In this way, the feedback signal may be divided into two paths, frequency side lobe power may be estimated from one path by the BPF and the ADC, and the constant value characteristic information shown in FIG. 5 may be retrieved after the other path passes through the ADC and the RRC and is resampled and normalized. At this moment, the original signal needs RRC processing, and in order to eliminate phase rotation after frequency conversion, the original signal needs to be compensated for with a phase rotation value $\theta$.

As shown in FIG. 11, the digital predistortion apparatus 1100 may further include a phase rotator 1106 configured to compensate for a phase rotation value for the signal before being inputted into the digital predistorter 100, so as to eliminate phase rotation after frequency conversion.

In this mode of implementation, the cost function generator 1004 may further be configured to calculate the cost function according to the side lobe information of the feedback signal, the constant value characteristic information and the predefined value. Details may include: generating the cost function according to the side lobe information of the feedback signal, so that the coefficient updater 1005 updates the coefficient of the nonlinear device; fixing the coefficient of the nonlinear device 1001, and then generating the cost function according to the constant value characteristic information and the predefined value, so that the coefficient updater 1005 updates resampling points T of the resampler 1103 and the phase rotation value $\theta$ of the phase rotator 1106; and fixing the coefficient of the nonlinear device 1001 and the resampling points T of the resampler 1103, and then generating the cost function according to the constant value characteristic information and the predefined value, so that the coefficient updater 1005 updates the phase rotation value θ of the phase rotator 1106 and the coefficients α, β, γ of the FIR filter 1002.

In particular implementation, a simplified error vector magnitude (SEVM) algorithm may be used for calculation. Taking 64QAM as an example, an SEVM calculation method may be:

$$SEVM = \Sigma_i \min(|V_i - [-7,-5,-3,-1,1,3,5,7]|);$$

where, $V_i$ is an output of the normalizer 1104, i.e. the constant value characteristic information of the signal;

and [−7, −5, −3, −1, 1, 3, 5, 7] are predefined values. A logic circuit, or the like, may be employed to carry out the above SEVM. And the relevant art may be referred to for details of the SEVM algorithm, which shall not be described herein any further.

Figure 12:
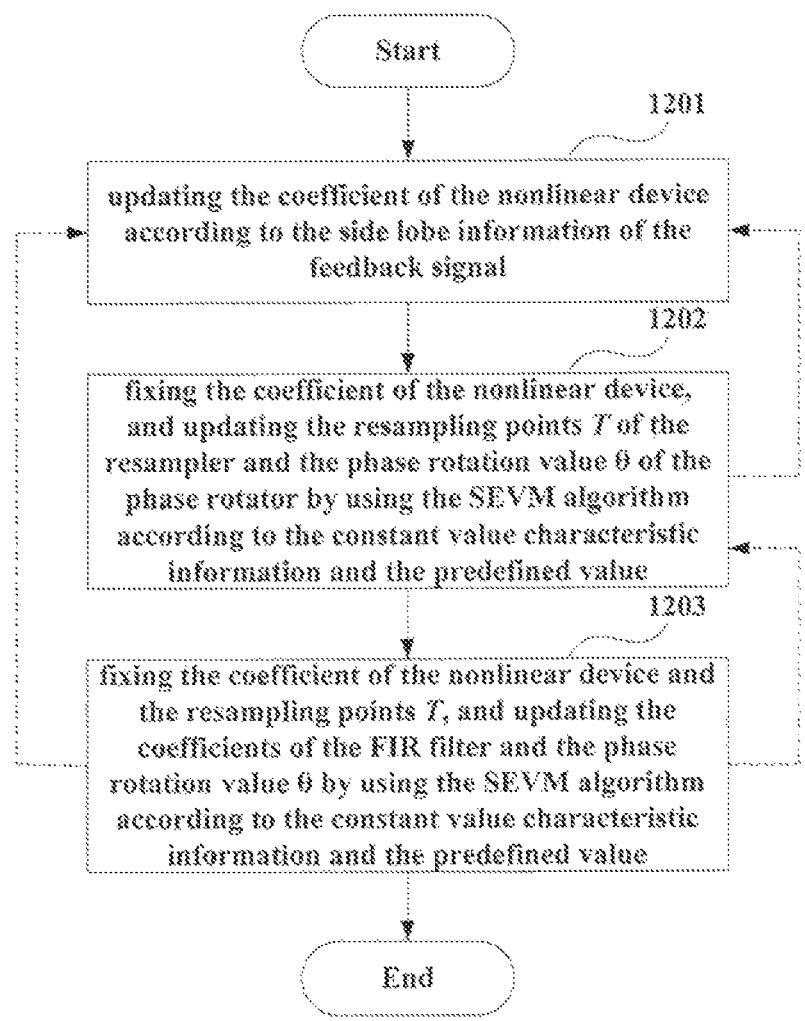
FIG. 12 is a schematic diagram of updating a coefficient by using an SEVM of an embodiment of the present application.

In particular implementation, a process of updating the parameters may include one or more times of iteration. FIG. 12 is a schematic diagram of updating a coefficient by using an SEVM of an embodiment of the present application. As shown in FIG. 12, the process of update may include:

step 1201: updating the coefficient of the nonlinear device according to the side lobe information of the feedback signal; the relevant art may be referred to for how to calculate the side lobe information and how to update the coefficient of the nonlinear device according to the side lobe information;

step 1202: fixing the coefficient of the nonlinear device, and updating the resampling points T of the resampler and the phase rotation value θ of the phase rotator by using the SEVM algorithm according to the constant value characteristic information and the predefined value; and step 1203: fixing the coefficient of the nonlinear device and the resampling points T, and updating the coefficients α, β, γ of the FIR filter and the phase rotation value θ by using the SEVM algorithm according to the constant value characteristic information and the predefined value.

It should be noted that one or more of the above steps may be carried out in an iterative manner. For example, steps 1202 and 1203 may be executed in an iterative manner after step 1201 is executed; for another example, orders of executing steps 1202 and 1203 may be interchanged, etc. Furthermore, the orders of searching the resampling points T and the phase rotation value θ may be changed according to actual situations, and the orders of searching the coefficients α, β, γ of the FIR filter and the phase rotation value θ may also be changed; for example, an order may be α, θ, β, γ, or θ, α, β, γ, or even be α, θ, β, θ, γ, etc. However, the present application is not limited thereto, and a particular mode of implementation may be determined according to an actual situation.

Figure 13:
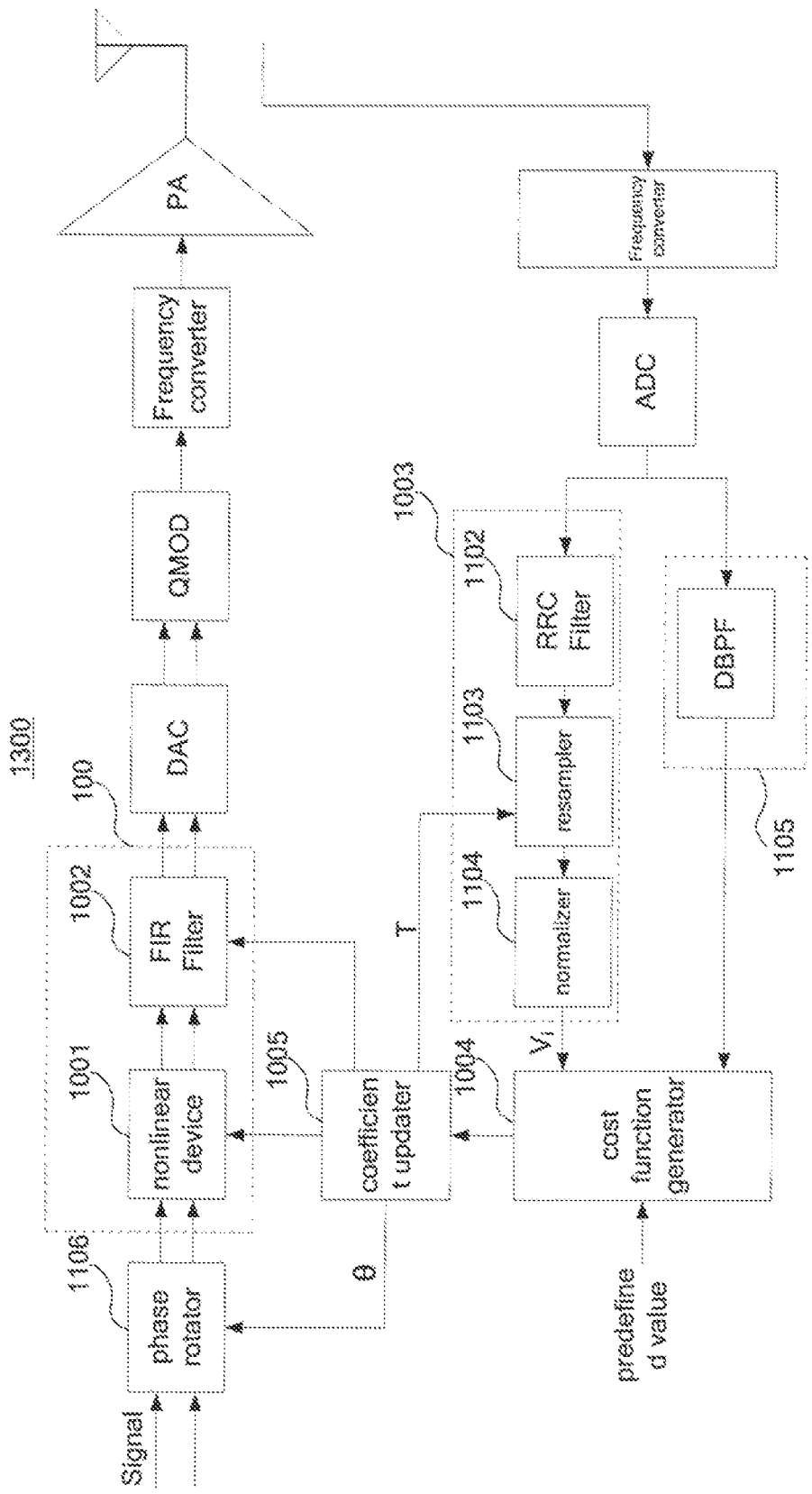
FIG. 13 is a further schematic diagram of the structure of the digital predistortion apparatus of the embodiment of the present application.

FIG. 13 is a further schematic diagram of the structure of the digital predistortion apparatus of the embodiment of the present application. As shown in FIG. 13, different from the digital predistortion apparatus 1100, the feedback signal in the digital predistortion apparatus 1300 may be divided into two paths after passing through an ADC, and the side lobe information of the feedback signal may be obtained by a digital bandpass filter (DBPF), thereby reducing the number of ADCs.

In another mode of implementation, it may be implemented according to a constant value characteristic of a modulus, and the coefficient of the nonlinear device may be calculated according to the side lobe information of the feedback signal.

Figure 14:
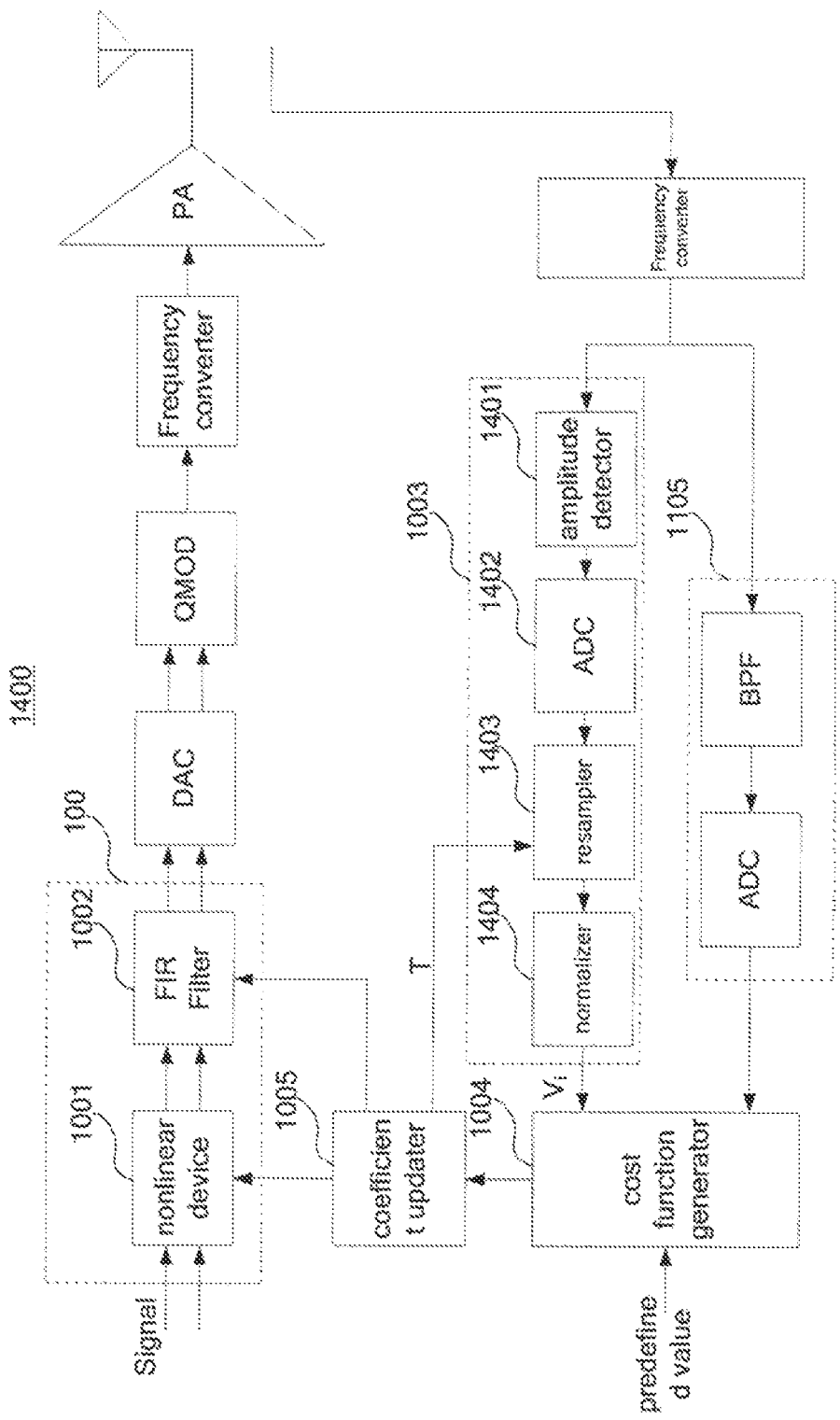
FIG. 14 is still another schematic diagram of the structure of the digital predistortion apparatus of the embodiment of the present application.

FIG. 14 is still another schematic diagram of the structure of the digital predistortion apparatus of the embodiment of the present application. As shown in FIG. 14, the digital predistortion apparatus 1400 includes: a digital predistorter 100, a constant value characteristic acquirer 1003, a cost function generator 1004 and a coefficient updater 1005; wherein, the digital predistorter 100 includes a nonlinear device 1001 and an FIR filter 1002, as described above.

As shown in FIG. 14, the digital predistortion apparatus 1100 may further include a side lobe information acquirer 1105 configured to process the feedback signal, so as to obtain side lobe information of the feedback signal. The feedback signal may be divided into two paths after frequency conversion, the constant value characteristic information is obtained from one path by the constant value characteristic acquirer 1003, and the side lobe information of the feedback signal is obtained from the other path by a BPF.

As shown in FIG. 14, the constant value characteristic acquirer 1003 may include: an amplitude detector 1401 configured to acquire an amplitude of the feedback signal; an analog-to-digital converter 1402 configured to convert the signal after being processed by the amplitude detector 1401 into a digital signal; a resampler 1403 configured to resample the digital signal; and a normalizer configured to normalize the resampled digital signal, so as to obtain the constant value characteristic information of the signal.

In this way, the feedback signal may be divided into two paths, frequency side lobe power may be estimated from one path by the BPF and the ADC, and the constant value characteristic information shown in FIG. 6 may be retrieved after the other path passes through the amplitude detector and the ADC and is resampled and normalized. It should be noted that the original signal needs RC processing.

In this mode of implementation, the cost function generator 1004 may further be configured to calculate the cost function according to the side lobe information of the feedback signal, the constant value characteristic information and the predefined value. Details may include: generating the cost function according to the side lobe information of the feedback signal, so that the coefficient updater 1005 updates the coefficient of the nonlinear device 1001; fixing the coefficient of the nonlinear device 1001, and then generating the cost function according to the constant value characteristic information and the predefined value, so that the coefficient updater 1005 updates the resampling points T of the resampler 1403; and fixing the coefficient of the nonlinear device 1001 and the resampling points T of the resampler 1403, and then generating the cost function according to the constant value characteristic information and the predefined value, so that the coefficient updater 1005 updates the coefficients α, β, γ of the FIR filter.

In particular implementation, an SEVM algorithm may be used for calculation, similar to that as described above. Taking 64QAM as an example, an SEVM calculation method may be:

$$SEVM = \Sigma_i \; \min(|V_i - [\sqrt{2}, \sqrt{10}, \sqrt{18}, \sqrt{26}, \sqrt{34}, \sqrt{50}, \sqrt{58}, \sqrt{74}, \sqrt{98}\,]|);$$

where, $V_i$ is an output of the normalizer 1404, i.e. the constant value characteristic information of the signal;

and [$\sqrt{2}, \sqrt{10}, \sqrt{18}, \sqrt{26}, \sqrt{34}, \sqrt{50}, \sqrt{58}, \sqrt{74}, \sqrt{98}$] are predefined values. A logic circuit, or the like, in the relevant art, may be employed to carry out the above SEVM, which shall not be described herein any further.

Figure 15:
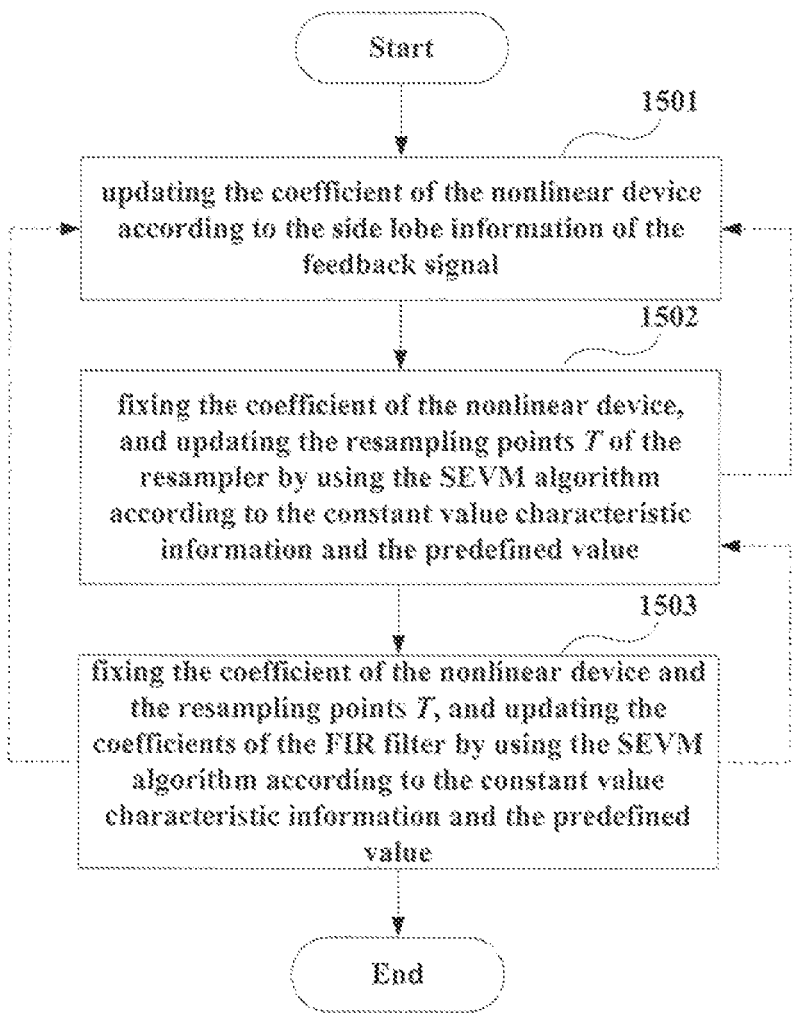
FIG. 15 is another schematic diagram of updating a coefficient by using an SEVM of the embodiment of the present application.

FIG. 15 is another schematic diagram of updating a coefficient by using an SEVM of the embodiment of the present application. As shown in FIG. 15, the process of update may include:

step 1501: updating the coefficient of the nonlinear device according to the side lobe information of the feedback signal; the relevant art may be referred to for how to calculate the side lobe information and how to update the coefficient of the nonlinear device according to the side lobe information;

step 1502: fixing the coefficient of the nonlinear device, and updating the resampling points T of the resampler by using the SEVM algorithm according to the constant value characteristic information and the predefined value; and step 1503: fixing the coefficient of the nonlinear device and the resampling points T, and updating the coefficients $\alpha, \beta, \gamma$ of the FIR filter by using the SEVM algorithm according to the constant value characteristic information and the predefined value.

It should be noted that one or more of the above steps may be carried out in an iterative manner. For example, steps 1502 and 1503 may be executed in an iterative manner after step 1501 is executed; for another example, orders of executing steps 1502 and 1503 may be interchanged, etc. However, the present application is not limited thereto, and a particular mode of implementation may be determined according to an actual situation.

Figure 16:
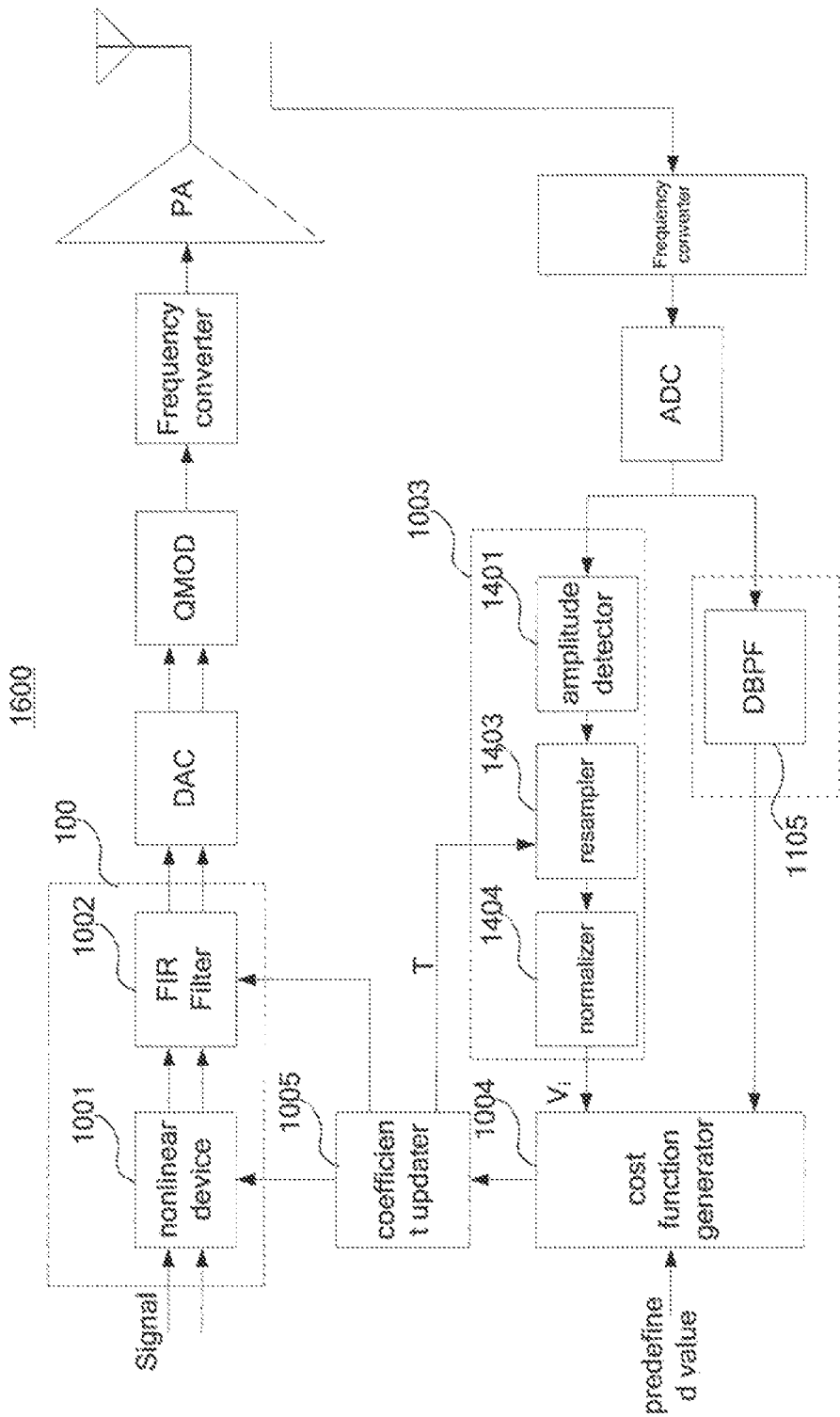
FIG. 16 is further still another schematic diagram of the structure of the digital predistortion apparatus of the embodiment of the present application.

FIG. 16 is further still another schematic diagram of the structure of the digital predistortion apparatus of the embodiment of the present application. As shown in FIG. 16, different from the digital predistortion apparatus 1400, the feedback signal in the digital predistortion apparatus 1600 may be divided into two paths after passing through an ADC, and the side lobe information of the feedback signal may be obtained by a DBPF, thereby reducing the number of ADCs.

In another mode of implementation, it may be implemented according to a constant value characteristic of I/Q-path signals, and the coefficient of the nonlinear device and the coefficient of the FIR filter may be updated according to a path of the signal.

Figure 17:
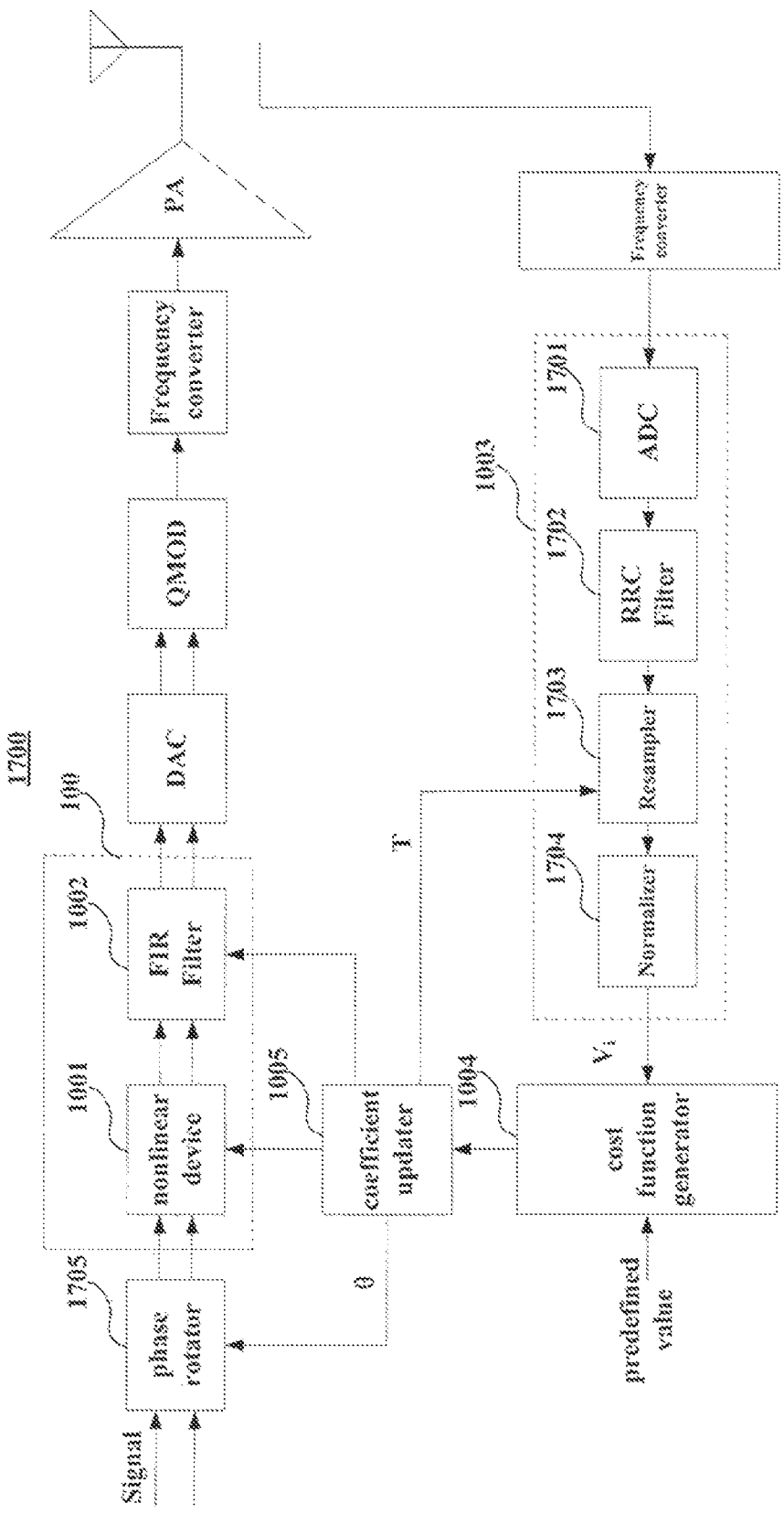
FIG. 17 is yet still another schematic diagram of the structure of the digital predistortion apparatus of the embodiment of the present application.

FIG. 17 is yet still another schematic diagram of the structure of the digital predistortion apparatus of the embodiment of the present application. As shown in FIG. 17, the digital predistortion apparatus 1700 includes: a digital predistorter 100, a constant value characteristic acquirer 1003, a cost function generator 1004 and a coefficient updater 1005; wherein, the digital predistorter 100 includes a nonlinear device 1001 and an FIR filter 1002, as described above.

As shown in FIG. 17, the constant value characteristic acquirer 1003 may include: an analog-to-digital converter 1701 configured to convert the feedback signal into a digital signal; an RRC filter 1702 configured to process I/Q signals of the digital signal; a resampler 1703 configured to resample the digital signal after being processed by the RRC filter 1702; and a normalizer 1704 configured to normalize the resampled digital signal, so as to obtain the constant value characteristic information of the signal.

In this way, the constant value characteristic information shown in FIG. 5 may be retrieved after the feedback signal passes through the ADC and the RRC filter 1702 and is resampled and normalized. At this moment, the original signal needs RRC processing, and in order to eliminate phase rotation after frequency conversion, the original signal needs to be compensated for with a phase rotation value $\theta$.

As shown in FIG. 17, the digital predistortion apparatus 1700 may further include a phase rotator 1705 configured to compensate for a phase rotation value $\theta$ for the signal before being inputted into the digital predistorter 100, so as to eliminate phase rotation after frequency conversion.

In this mode of implementation, the cost function generator 1004 may further be configured to calculate the cost function according to the constant value characteristic information and the predefined value. Details may include: generating the cost function according to the constant value characteristic information and the predefined value, so that the coefficient updater 1005 updates the resampling points T of the resampler 1703 and the phase rotation value $\theta$ of the phase rotator 1705; fixing the resampling points T of the resampler 1703, and then generating the cost function according to the constant value characteristic information and the predefined value, so that the coefficient updater 1005 updates the phase rotation value $\theta$ of the phase rotator 1705 and the coefficients $\alpha, \beta, \gamma$ of the FIR filter; and fixing the resampling points T of the resampler 1703 and the coefficients $\alpha, \beta, \gamma$ of the FIR filter, and then generating the cost function according to the constant value characteristic information and the predefined value, so that the coefficient updater 1005 updates the phase rotation value $\theta$ of the phase rotator 1705 and the coefficient of the nonlinear device.

In particular implementation, an SEVM algorithm may be used for calculation. Taking 64QAM as an example, an SEVM calculation method may be:

$$SEVM = \Sigma_i \min(|V_i - [-7, -5, -3, -1, 1, 3, 5, 7]|);$$

where, $V_i$ is an output of the normalizer 1704, i.e. the constant value characteristic information of the signal;

and $[-7, -5, -3, -1, 1, 3, 5, 7]$ are predefined values. A logic circuit, or the like, in the relevant art, may be employed to carry out the above SEVM, which shall not be described herein any further.

Figure 18:
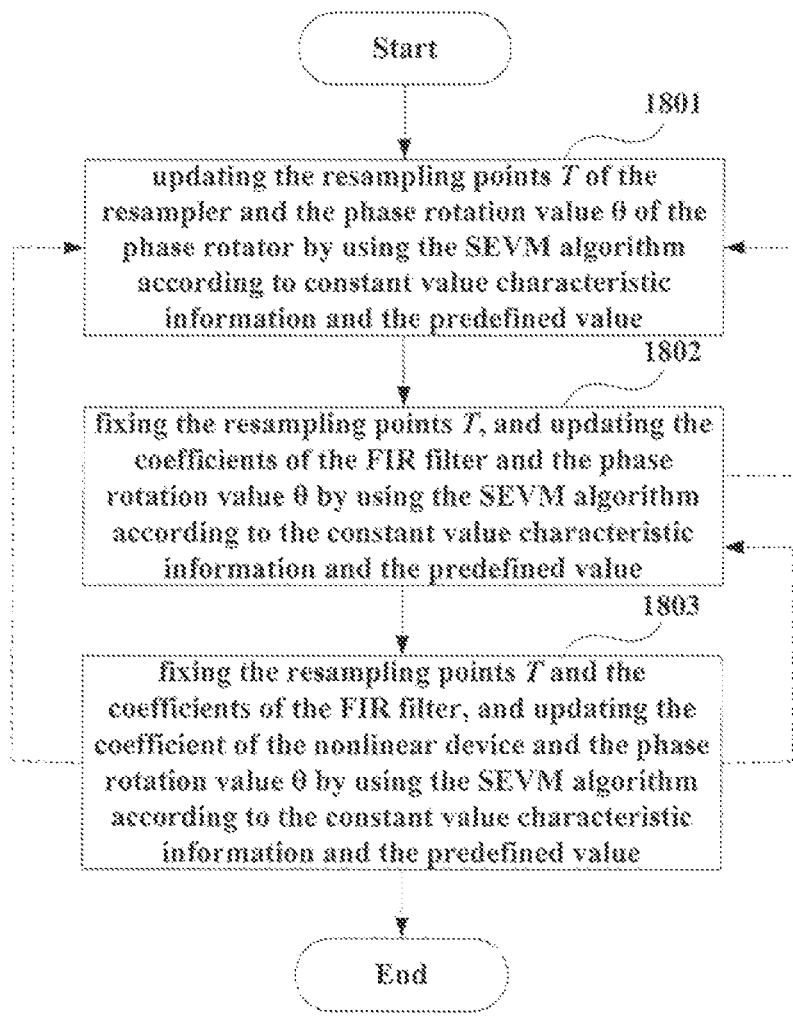
FIG. 18 is a further schematic diagram of updating a coefficient by using an SEVM of the embodiment of the present application.

FIG. 18 is a further schematic diagram of updating a coefficient by using an SEVM of the embodiment of the present application. As shown in FIG. 18, the process of update may include:

step 1801: updating the resampling points T of the resampler and the phase rotation value $\theta$ of the phase rotator by using the SEVM algorithm according to constant value characteristic information and the predefined value;

step 1802: fixing the resampling points T, and updating the coefficients $\alpha, \beta, \gamma$ of the FIR filter and the phase rotation value $\theta$ by using the SEVM algorithm according to the constant value characteristic information and the predefined value; and step 1803: fixing the resampling points T and the coefficients $\alpha, \beta, \gamma$ of the FIR filter, and updating the coefficient of the nonlinear device and the phase rotation value $\theta$ by using the SEVM algorithm according to the constant value characteristic information and the predefined value.

It should be noted that one or more of the above steps may be carried out in an iterative manner. For example, steps 1802 and 1803 may be executed in an iterative manner after step 1801 is executed; for another example, orders of executing steps 1802 and 1803 may be interchanged, etc. Furthermore, the orders of searching the coefficient of the nonlinear device and the phase rotation value $\theta$ may be changed according to actual situations, the orders of searching the resampling points T and the phase rotation value $\theta$ may also be changed according to actual situations, and the orders of searching the coefficients $\alpha, \beta, \gamma$ of the FIR filter and the phase rotation value $\theta$ may also be changed; for example, an order may be $\alpha, \theta, \beta, \gamma$, or $\theta, \alpha, \beta, \gamma$, or even be $\alpha, \theta, \beta, \theta, \gamma$, etc. However, the present application is not limited thereto, and a particular mode of implementation may be determined according to an actual situation.

In another mode of implementation, it may be implemented according to a constant value characteristic of a modulus, and the coefficient of the nonlinear device and the coefficient of the FIR filter may be updated according to a path of the signal.

Figure 19:
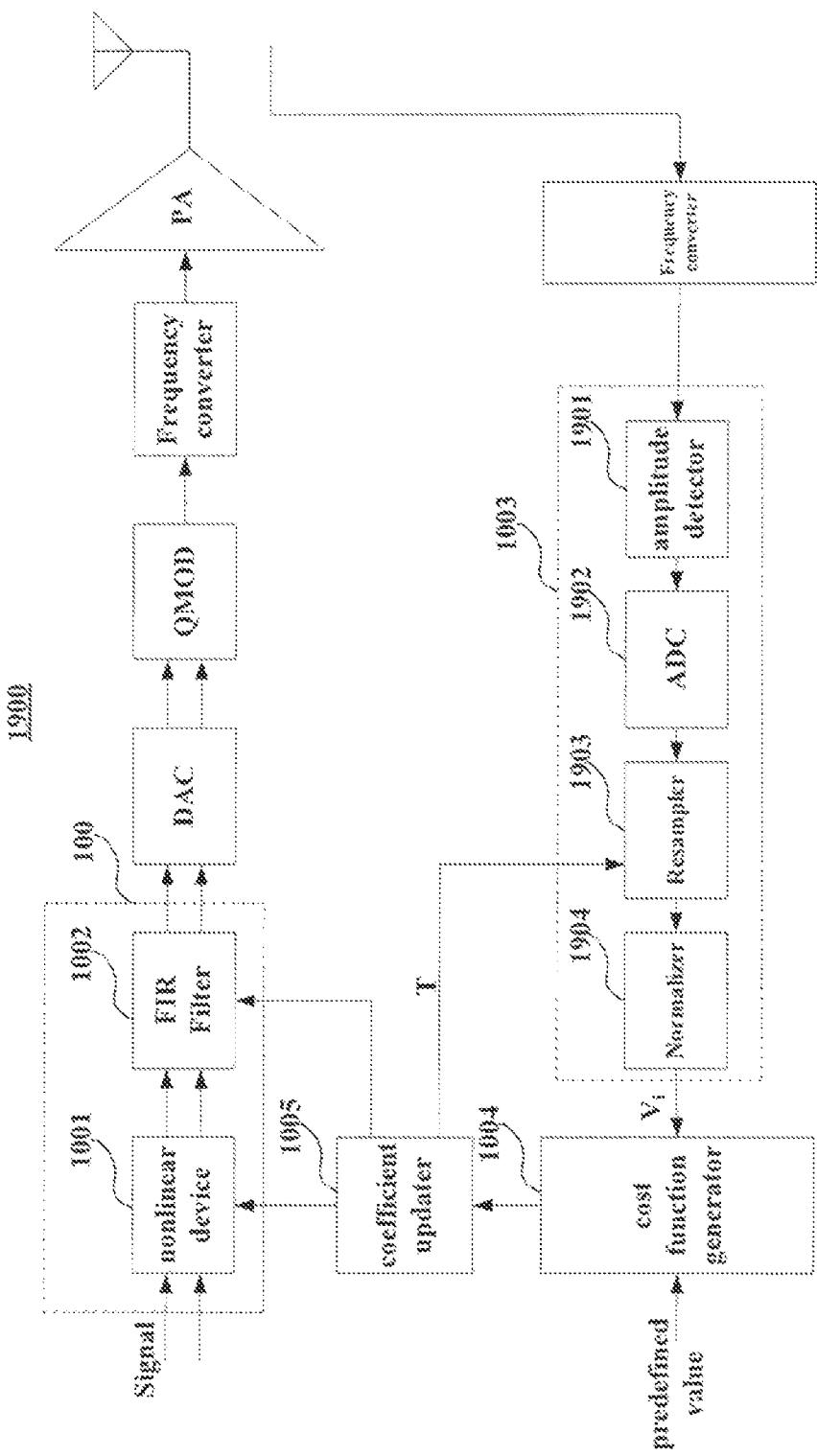
FIG. 19 is a yet further schematic diagram of the structure of the digital predistortion apparatus of the embodiment of the present application.

FIG. 19 is a yet further schematic diagram of the structure of the digital predistortion apparatus of the embodiment of the present application. As shown in FIG. 19, the digital predistortion apparatus 1900 includes: a digital predistorter 100, a constant value characteristic acquirer 1003, a cost function generator 1004 and a coefficient updater 1005; wherein, the digital predistorter 100 includes a nonlinear device 1001 and an FIR filter 1002, as described above.

As shown in FIG. 19, the constant value characteristic acquirer 1003 may include: an amplitude detector 1901 configured to acquire an amplitude of the feedback signal; an analog-to-digital converter 1902 configured to convert the signal after being processed by the amplitude detector 1901 into a digital signal; a resampler 1903 configured to resample the digital signal; and a normalizer 1904 configured to normalize the resampled digital signal, so as to obtain the constant value characteristic information of the signal.

In this way, the constant value characteristic information shown in FIG. 6 may be retrieved after the feedback signal passes through the amplitude detector and the ADC and is resampled and normalized. It should be noted that the original signal needs RC processing.

In this mode of implementation, the cost function generator 1004 may further be configured to calculate the cost function according to the constant value characteristic information and the predefined value. Details may include: generating the cost function according to the constant value characteristic information and the predefined value, so that the coefficient updater 1005 updates the resampling points T of the resampler 1903; fixing the resampling points T of the resampler 1903, and then generating the cost function according to the constant value characteristic information and the predefined value, so that the coefficient updater 1005 updates the coefficients $\alpha, \beta, \gamma$ of the FIR filter; and fixing the resampling points T of the resampler 1903 and the coefficients $\alpha, \beta, \gamma$ of the FIR filter, and then generating the cost function according to the constant value characteristic information and the predefined value, so that the coefficient updater 1005 updates the coefficient of the nonlinear device.

In particular implementation, an SEVM algorithm may be used for calculation, similar to that as described above. Taking 64QAM as an example, an SEVM calculation method may be:

$$SEVM = \Sigma_i \, \min(|V_i - [\sqrt{2}, \sqrt{10}, \sqrt{18}, \sqrt{26}, \sqrt{34}, \sqrt{50}, \sqrt{58}, \sqrt{74}, \sqrt{98}\,]);$$

where, $V_i$ is an output of the normalizer 1904, i.e. the constant value characteristic information of the signal;

and $[\sqrt{2}, \sqrt{10}, \sqrt{18}, \sqrt{26}, \sqrt{34}, \sqrt{50}, \sqrt{58}, \sqrt{74}, \sqrt{98}]$ are predefined values. A logic circuit, or the like, in the relevant art, may be employed to carry out the above SEVM, which shall not be described herein any further.

Figure 20:
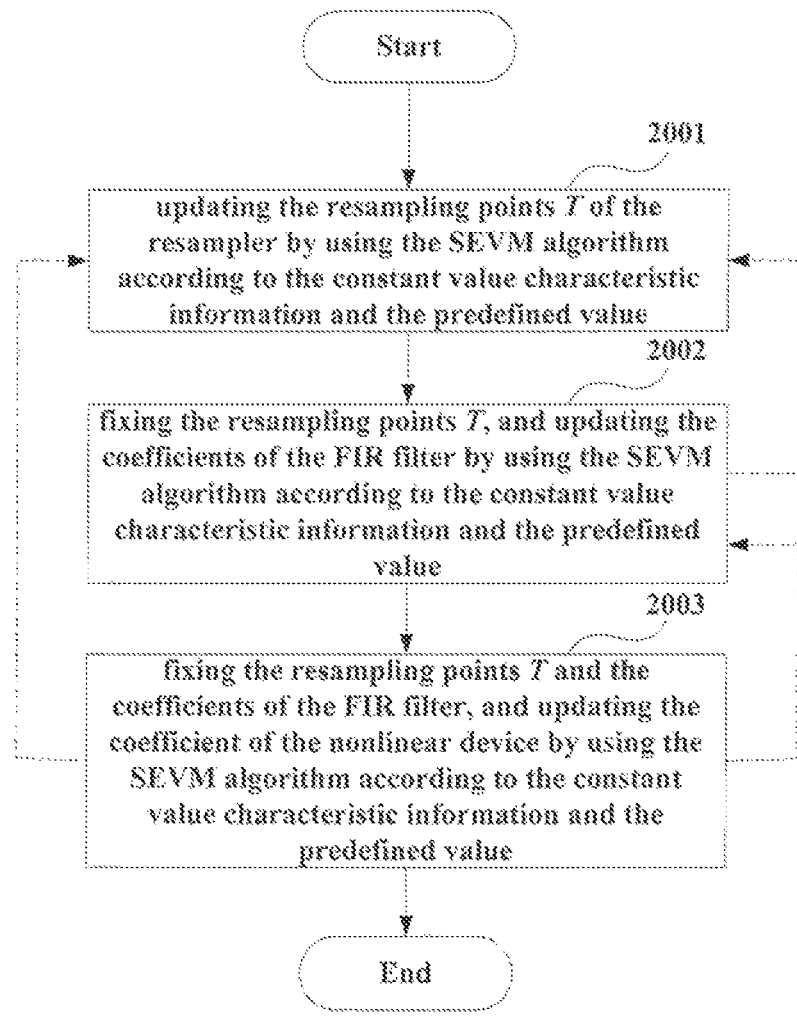
FIG. 20 is still another schematic diagram of updating a coefficient by using an SEVM of the embodiment of the present application.

FIG. 20 is still another schematic diagram of updating a coefficient by using an SEVM of the embodiment of the present application. As shown in FIG. 20, the process of update may include:

step 2001: updating the resampling points T of the resampler by using the SEVM algorithm according to the constant value characteristic information and the predefined value;

step 2002: fixing the resampling points T, and updating the coefficients $\alpha, \beta, \gamma$ of the FIR filter by using the SEVM algorithm according to the constant value characteristic information and the predefined value; and step 2003: fixing the resampling points T and the coefficients $\alpha, \beta, \gamma$ of the FIR filter, and updating the coefficient of the nonlinear device by using the SEVM algorithm according to the constant value characteristic information and the predefined value.

It should be noted that one or more of the above steps may be carried out in an iterative manner. For example, steps 2002 and 2003 may be executed in an iterative manner after step 2001 is executed; for another example, orders of executing steps 2002 and 2003 may be interchanged, etc. However, the present application is not limited thereto, and a particular mode of implementation may be determined according to an actual situation.

How to update the coefficient of the nonlinear device and the coefficients of the FIR filter of the present application are schematically described above taking 64QAM signals and the SEVM as examples. However, the present application is not limited thereto, and a particular mode of implementation may be determined according to an actual situation.

Furthermore, in the implementation according to the constant value characteristics of I/Q signals, or in the implementation according to the constant value characteristic of the modulus, a signal may be adjusted accordingly based on a particular mode of implementation. For example, an output signal of a frequency converter may be changed, a feedback signal may be changed into a zero frequency or an intermediate frequency according to an actual situation, etc.

It can be seen from the above embodiments that by calculating the predistorted cost function according to the constant value characteristic information and the predefined value, and updating the coefficient of the nonlinear device and the coefficient of the memory effect compensator, not only nonlinearity and memory effect distortion of a signal may be compensated, but also the structure is simple and low in cost, thereby simply and efficiently improving quality of a transmission signal.

Embodiment 2

An embodiment of the present application provides a digital predistortion method, wherein a nonlinear characteristic of a signal is compensated by using a nonlinear device and a memory effect characteristic of the signal is compensated by using a memory effect compensator. This embodiment of the present application corresponds to the digital predistortion apparatus of Embodiment 1, and the contents identical to those in Embodiment 1 shall not be described any further.

Figure 21:
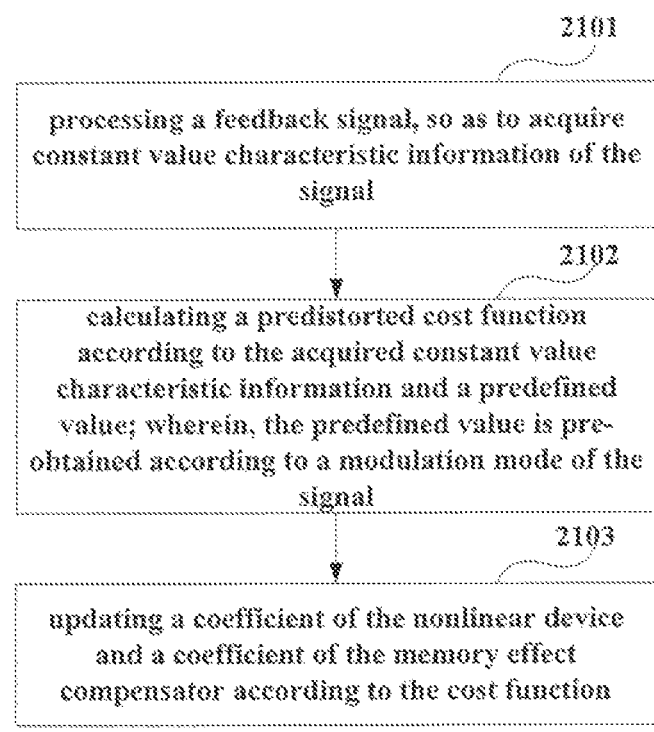
FIG. 21 is a flowchart of a digital predistortion method of an embodiment of the present application.

FIG. 21 is a flowchart of a digital predistortion method of an embodiment of the present application. As shown in FIG. 21, the method may include:

step 2101: processing a feedback signal, so as to acquire constant value characteristic information of the signal;

step 2102: calculating a predistorted cost function according to the acquired constant value characteristic information and a predefined value; wherein, the predefined value is pre-obtained according to a modulation mode of the signal; and step 2103: updating a coefficient of the nonlinear device and a coefficient of the memory effect compensator according to the cost function.

In this embodiment, the relevant art may be referred to for a particular structure of the nonlinear device, and an FIR filter may be used as the memory effect compensator. However, the present application is not limited thereto. For example, an IIR filter may also be used.

In a mode of implementation, it may be implemented according to constant value characteristics of I/Q-path signals, and the coefficient of the nonlinear device may be calculated according to side lobe information of the feedback signal. And the digital predistortion method may further include: processing the feedback signal, so as to obtain side lobe information of the feedback signal; and calculating the cost function according to the side lobe information of the feedback signal, the constant value characteristic information and the predefined value.

In another mode of implementation, it may be implemented according to constant value characteristics of I/Q-path signals, and the coefficient of the nonlinear device and the coefficient of the memory effect compensator may be updated according to a path of the signal.

It can be seen from the above embodiments that by calculating the predistorted cost function according to the constant value characteristic information and the predefined value, and updating the coefficient of the nonlinear device and the coefficient of the memory effect compensator, not only nonlinearity and memory effect distortion of a signal may be compensated, but also the structure is simple and low in cost, thereby simply and efficiently improving quality of a transmission signal.

The above apparatus and method of the present application may be implemented by hardware, or by hardware in combination with software. The present application relates to such a computer-readable program that when the program is executed by a logic device, the logic device is enabled to carry out the apparatus or components as described above, or to carry out the methods or steps as described above. The present application also relates to a storage medium for storing the above program, such as a hard disk, a floppy disk, a CD, a DVD, and a flash memory, etc.

The present application is described above with reference to particular embodiments. However, it should be understood by those skilled in the art that such a description is illustrative only, and not intended to limit the protection scope of the present application. Various variants and modifications may be made by those skilled in the art according to the spirits and principle of the present application, and such variants and modifications fall within the scope of the present application.

For the implementation of the present application containing the above embodiments, following supplements are further disclosed.

Supplement 1. A digital predistortion apparatus, including:
a nonlinear device configured to compensate for a nonlinear characteristic of a signal;
a memory effect compensator configured to compensate for a memory effect characteristic of the signal;
a constant value characteristic acquirer configured to process a feedback signal, so as to acquire constant value characteristic information of the signal;
a cost function generator configured to calculate a predistorted cost function according to the acquired constant value characteristic information and a predefined value; wherein, the predefined value is pre-obtained according to a modulation mode of the signal; and
a coefficient updater configured to update a coefficient of the nonlinear device and a coefficient of the memory effect compensator according to the cost function.

Supplement 2. The digital predistortion apparatus according to supplement 1, wherein the digital predistortion apparatus further includes:
a side lobe information acquirer configured to process the feedback signal, so as to obtain side lobe information of the feedback signal;
and the cost function generator is further configured to calculate the cost function according to the side lobe information of the feedback signal, the constant value characteristic information and the predefined value.

Supplement 3. The digital predistortion apparatus according to supplement 2, wherein the constant value characteristic acquirer includes:
an analog-to-digital converter configured to convert the feedback signal into a digital signal;
a root raised cosine filter configured to process in-phase and quadrature signals of the digital signal;
a resampler configured to resample the digital signal after being processed by the root raised cosine filter; and
a normalizer configured to normalize the resampled digital signal, so as to obtain the constant value characteristic information of the signal.

Supplement 4. The digital predistortion apparatus according to supplement 2 or 3, wherein the digital predistortion apparatus further includes:
a phase rotator configured to compensate for a phase rotation value for the signal before being inputted into a digital predistorter, so as to eliminate phase rotation after frequency conversion.

Supplement 5. The digital predistortion apparatus according to supplement 4, wherein the cost function generator is configured to:
generate the cost function according to the side lobe information of the feedback signal, so that the coefficient updater updates the coefficient of the nonlinear device;
fix the coefficient of the nonlinear device, and then generate the cost function according to the constant value characteristic information and the predefined value, so that the coefficient updater updates resampling points of the resampler and the phase rotation value of the phase rotator; and
fix the coefficient of the nonlinear device and the resampling points of the resampler, and then generate the cost function according to the constant value characteristic information and the predefined value, so that the coefficient updater updates the phase rotation value of the phase rotator and the coefficient of the memory effect compensator.

Supplement 6. The digital predistortion apparatus according to supplement 2, wherein the constant value characteristic acquirer includes:
an amplitude detector configured to acquire an amplitude of the feedback signal;
an analog-to-digital converter configured to convert the signal after being processed by the amplitude detector into a digital signal;
a resampler configured to resample the digital signal; and
a normalizer configured to normalize the resampled digital signal, so as to obtain the constant value characteristic information of the signal.

Supplement 7. The digital predistortion apparatus according to supplement 6, wherein the cost function generator is configured to:
generate the cost function according to the side lobe information of the feedback signal, so that the coefficient updater updates the coefficient of the nonlinear device;
fix the coefficient of the nonlinear device, and then generate the cost function according to the constant value characteristic information and the predefined value, so that the coefficient updater updates the resampling points of the resampler; and
fix the coefficient of the nonlinear device and the resampling points of the resampler, and then generate the cost function according to the constant value characteristic information and the predefined value, so that the coefficient updater updates the coefficient of the memory effect compensator.

Supplement 8. The digital predistortion apparatus according to supplement 1, wherein the constant value characteristic acquirer includes:

an analog-to-digital converter configured to convert the feedback signal into a digital signal;

a root raised cosine filter configured to process in-phase and quadrature signals of the digital signal;

a resampler configured to resample the digital signal after being processed by the root raised cosine filter; and a normalizer configured to normalize the resampled digital signal, so as to obtain the constant value characteristic information of the signal.

Supplement 9. The digital predistortion apparatus according to supplement 8, wherein the digital predistortion apparatus further includes:

a phase rotator configured to compensate for a phase rotation value for the signal before being inputted into a digital predistorter, so as to eliminate phase rotation after frequency conversion.

Supplement 10. The digital predistortion apparatus according to supplement 9, wherein the cost function generator is configured to:

generate the cost function according to the constant value characteristic information and the predefined value, so that the coefficient updater updates the resampling points of the resampler and the phase rotation value of the phase rotator;

fix the resampling points of the resampler, and then generate the cost function according to the constant value characteristic information and the predefined value, so that the coefficient updater updates the phase rotation value of the phase rotator and the coefficient of the memory effect compensator; and fix the resampling points of the resampler and the coefficient of the memory effect compensator, and then generate the cost function according to the constant value characteristic information and the predefined value, so that the coefficient updater updates the phase rotation value of the phase rotator and the coefficient of the nonlinear device.

Supplement 11. A digital predistortion method, wherein a nonlinear characteristic of a signal is compensated by using a nonlinear device and a memory effect characteristic of the signal is compensated by using a memory effect compensator; the method including:

processing a feedback signal, so as to acquire constant value characteristic information of the signal;

calculating a predistorted cost function according to the acquired constant value characteristic information and a predefined value; wherein, the predefined value is pre-obtained according to a modulation mode of the signal; and updating a coefficient of the nonlinear device and a coefficient of the memory effect compensator according to the cost function.

Supplement 12. The digital predistortion method according to supplement 11, wherein the digital predistortion method further includes:

processing the feedback signal, so as to obtain side lobe information of the feedback signal; and calculating the cost function according to the side lobe information of the feedback signal, the constant value characteristic information and the predefined value.

Supplement 13. The digital predistortion method according to supplement 12, wherein the step of processing feedback signal so as to acquire constant value characteristic information of the signal, includes:

converting the feedback signal into a digital signal;

processing in-phase and quadrature signals of the digital signal by a root raised cosine filter, resampling the digital signal after being processed by the root raised cosine filter; and normalizing the resampled digital signal, so as to obtain the constant value characteristic information of the signal.

Supplement 14. The digital predistortion method according to supplement 12 or 13, wherein the digital predistortion method further includes:

compensating for a phase rotation value for the signal before being inputted into a digital predistorter, so as to eliminate phase rotation after frequency conversion.

Supplement 15. The digital predistortion method according to supplement 14, wherein the step of calculating the cost function according to the side lobe information of the feedback signal, the constant value characteristic information and the predefined value, includes:

generating the cost function according to the side lobe information of the feedback signal, so that the coefficient updater updates the coefficient of the nonlinear device;

fixing the coefficient of the nonlinear device, and then generating the cost function according to the constant value characteristic information and the predefined value, so that the coefficient updater updates resampling points of the resampler and the phase rotation value of the phase rotator; and fixing the coefficient of the nonlinear device and the resampling points of the resampler, and then generating the cost function according to the constant value characteristic information and the predefined value, so that the coefficient updater updates the phase rotation value of the phase rotator and the coefficient of the memory effect compensator.

Supplement 16. The digital predistortion method according to supplement 12, wherein the step of processing the feedback signal so as to obtain side lobe information of the feedback signal, includes:

acquiring an amplitude of the feedback signal;

converting the processed signal into a digital signal;

resampling the digital signal; and normalizing the resampled digital signal, so as to obtain the constant value characteristic information of the signal.

Supplement 17. The digital predistortion method according to supplement 16, wherein the step of calculating the cost function according to the side lobe information of the feedback signal, the constant value characteristic information and the predefined value, includes:

generating the cost function according to the side lobe information of the feedback signal, so that the coefficient of the nonlinear device is updated;

fixing the coefficient of the nonlinear device, and then generating the cost function according to the constant value characteristic information and the predefined value, so that the resampling points of the resampler is updated; and fixing the coefficient of the nonlinear device and the resampling points of the resampler, and then generating the cost function according to the constant value characteristic information and the predefined value, so that the coefficient of the memory effect compensator is updated.

Supplement 18. The digital predistortion method according to supplement 11, wherein the step of processing feedback signal so as to acquire constant value characteristic information of the signal, includes:

converting the feedback signal into a digital signal;

processing in-phase and quadrature signals of the digital signal by a root raised cosine filter, resampling the digital signal after being processed by the root raised cosine filter; and normalizing the resampled digital signal, so as to obtain the constant value characteristic information of the signal.

Supplement 19. The digital predistortion method according to supplement 18, wherein the digital predistortion method further includes:

compensating for a phase rotation value for the signal before being inputted into a digital predistorter, so as to eliminate phase rotation after frequency conversion.

Supplement 20. The digital predistortion method according to supplement 19, wherein the step of calculating a predistorted cost function according to the acquired constant value characteristic information and a predefined value, includes:

generating the cost function according to the constant value characteristic information and the predefined value, so that the coefficient updater updates the resampling points of the resampler and the phase rotation value of the phase rotator;

fixing the resampling points of the resampler, and then generating the cost function according to the constant value characteristic information and the predefined value, so that the coefficient updater updates the phase rotation value of the phase rotator and the coefficient of the memory effect compensator; and fixing the resampling points of the resampler and the coefficient of the memory effect compensator, and then generating the cost function according to the constant value characteristic information and the predefined value, so that the coefficient updater updates the phase rotation value of the phase rotator and the coefficient of the nonlinear device.

Supplement 21. A computer-readable program, wherein when the program is executed in a digital predistortion apparatus, the program enables a computer to carry out the digital predistortion method as described in any one of supplements 11-20 in the digital predistortion apparatus.

Supplement 22. A storage medium in which a computer-readable program is stored, wherein the computer-readable program enables a computer to carry out the digital predistortion method as described in any one of supplements 11-20 in a digital predistortion apparatus.

The invention claimed is:

1. A digital predistortion apparatus, comprising:
   a nonlinear device configured to compensate for a nonlinear characteristic of a signal;
   a memory effect compensator configured to compensate for a memory effect characteristic of the signal;
   a constant value characteristic acquirer configured to process a feedback signal, so as to acquire constant value characteristic information of the signal;
   a side lobe information acquirer configured to process the feedback signal to as to obtain side lobe information of the feedback signal;
   a cost function generator configured to calculate a predistorted cost function according to the side lobe information of the feedback signal, the acquired constant value characteristic information and a predefined value, the predefined value being pre-obtained according to a modulation mode of the signal; and
   a coefficient updater configured to update a coefficient of the nonlinear device and a coefficient of the memory effect compensator according to the cost function.

2. The digital predistortion apparatus according to claim 1, wherein the digital predistortion apparatus further comprises:
   a phase rotator configured to compensate for a phase rotation value for the signal before being inputted into a digital predistorter, so as to eliminate phase rotation after frequency conversion; and
   wherein the constant value characteristic acquirer comprises:
   an analog-to-digital converter configured to convert the feedback signal into a digital signal;
   a root raised cosine filter configured to process in-phase signals and quadrature signals of the digital signal;
   a resampler configured to resample the digital signal after being processed by the root raised cosine filter; and
   a normalizer configured to normalize the resampled digital signal, so as to obtain the constant value characteristic information of the signal.

3. The digital predistortion apparatus according to claim 2, wherein the cost function generator is configured to:
   generate the cost function according to the side lobe information of the feedback signal, so that the coefficient updater updates the coefficient of the nonlinear device;
   fix the coefficient of the nonlinear device, and then generate the cost function according to the constant value characteristic information and the predefined value, so that the coefficient updater updates resampling points of the resampler and the phase rotation value of the phase rotator; and
   fix the coefficient of the nonlinear device and the resampling points of the resampler, and then generate the cost function according to the constant value characteristic information and the predefined value, so that the coefficient updater updates the phase rotation value of the phase rotator and the coefficient of the memory effect compensator.

4. The digital predistortion apparatus according to claim 1, wherein the constant value characteristic acquirer comprises:
   an amplitude detector configured to acquire an amplitude of the feedback signal;
   an analog-to-digital converter configured to convert the signal after being processed by the amplitude detector into a digital signal;
   a resampler configured to resample the digital signal; and
   a normalizer configured to normalizer the resampled digital signal, so as to obtain the constant value characteristic information of the signal.

5. The digital predistortion apparatus according to claim 4, wherein the cost function generator is configured to:
   generate the cost function according to the side lobe information of the feedback signal, so that the coefficient updater updates the coefficient of the nonlinear device;
   fix the coefficient of the nonlinear device, and then generate the cost function according to the constant value characteristic information and the predefined value, so that the coefficient updater updates the resampling points of the resampler; and
   fix the coefficient of the nonlinear device and the resampling points of the resampler, and then generate the cost function according to the constant value characteristic information and the predefined value, so that the coefficient updater updates the coefficient of the memory effect compensator.

6. A digital predistortion method, wherein a nonlinear characteristic of a signal is compensated by using a nonlinear device and a memory effect characteristic of the signal is compensated by using a memory effect compensator, the digital predistortion method comprising:
   processing a feedback signal, so as to acquire constant value characteristic information of the signal;
   processing the feedback signal so as to obtain side lobe information of the feedback signal;
   calculating a predistorted cost function according to the side lobe information of the feedback signal, the acquired constant value characteristic information and a predefined value, the predefined value being pre-obtained according to a modulation mode of the signal; and updating a coefficient of the nonlinear device and a coefficient of the memory effect compensator according to the cost function.

7. A digital predistortion method, wherein a nonlinear characteristic of a signal is compensated by using a nonlinear device and a memory effect characteristic of the signal is compensated by using a memory effect compensator, the digital predistortion method comprising:

compensating for a phase rotation value for a signal before being inputted into a digital predistorter, so as to eliminate phase rotation after frequency conversion;

processing a feedback signal, so as to acquire constant value characteristic information of the signal;

calculating a predistorted cost function according to the acquired constant value characteristic information and a predefined value, the predefined value being pre-obtained according to a modulation mode of the signal; and updating a coefficient of the nonlinear device and a coefficient of the memory effect compensator according to the cost function.

8. A digital predistortion apparatus, comprising:

a phase rotator configured to compensate for a phase rotation value for a signal before being inputted into a digital predistorter, so as to eliminate phase rotation after frequency conversion;

a nonlinear device configured to compensate for a nonlinear characteristic of the signal;

a memory effect compensator configured to compensate for a memory effect characteristic of the signal;

a constant value characteristic acquirer configured to process a feedback signal so as to acquire constant value characteristic information of the signal;

a cost function generator configured to calculate a predistorted cost function according to the acquired constant value characteristic information and a predefined value, the predefined value being pre-obtained according to a modulation mode of the signal; and a coefficient updater configured to update a coefficient of the nonlinear device and a coefficient of the memory effect compensator according to the cost function.

9. The digital predistortion apparatus according to claim 8, wherein the constant value characteristic acquirer comprises:

an analog-to-digital converter configured to convert the feedback signal into a digital signal;

a root raised cosine filter configured to process in-phase signals and quadrature signals of the digital signal;

a resampler configured to resample the digital signal after being processed by the root raised cosine filter; and a normalizer configured to normalize the resampled digital signal, so as to obtain the constant value characteristic information of the signal.

10. The digital predistortion apparatus according to claim 9, wherein the cost function generator is configured to:

generate the cost function according to the constant value characteristic information and the predefined value, so that the coefficient updater updates the resampling points of the resampler and the phase rotation value of the phase rotator;

fix the resampling points of the resampler, and then generate the cost function according to the constant value characteristic information and the predefined value, so that the coefficient updater updates the phase rotation value of the phase rotator and the coefficient of the memory effect compensator; and fix the resampling points of the resampler and the coefficient of the memory effect compensator, and then generate the cost function according to the constant value characteristic information and the predefined value, so that the coefficient updater updates the phase rotation value of the phase rotator and the coefficient of the nonlinear device.

11. A digital predistortion apparatus, comprising:

a nonlinear device configured to compensate for a nonlinear characteristic of a signal;

a memory effect compensator configured to compensate for a memory effect characteristic of the signal;

a constant value characteristic acquirer configured to produce a feedback signal, so as to acquire constant value characteristic information of the signal;

a cost function generator configured to calculate a predistorted cost function according to the acquired constant value characteristic information and a predefined value, the predefined value being pre-obtained according to a modulation mode of the signal; and a coefficient update configured to update a coefficient of the nonlinear device and a coefficient of the memory effect compensator according to the cost function, wherein the constant value characteristic acquirer comprises:

an amplitude detector configured to acquire an amplitude of the feedback signal;

an analog-to-digital converter configured to convert the signal, after being processed by the amplitude detector into a digital signal;

a resampler configured to resample the digital signal; and a normalizer configured to normalize the resampled digital signal, so as to obtain the constant value characteristic information of the signal.

12. A digital predistortion method, wherein a nonlinear characteristic of a signal is compensated by using a nonlinear device is used and a memory effect characteristic of the signal is compensated by using a memory effect compensator, the digital predistortion method comprising:

processing a feedback signal so as to acquire value characteristic information of the signal;

calculating a predistorted cost function according to the acquired constant value characteristic information and a predefined value, the predefined value being pre-obtained according to a modulation mode of the signal; and updating a coefficient of the nonlinear device and a coefficient of the memory effect compensator according to the cost function, wherein the processing of the feedback signal so as to acquire value characteristic information of the signal comprises:

acquiring an amplitude of the feedback signal;

converting the signal after the processing of amplitude detection into a digital signal;

resampling the digital signal; and normalizing the resampled digital signal so as to obtain the constant value characteristic information of the signal.

* * * * *